(12) United States Patent
Lee et al.

(10) Patent No.: US 12,488,996 B2
(45) Date of Patent: Dec. 2, 2025

(54) SEMICONDUCTOR PACKAGE HAVING PAD PATTERN INCLUDING PLASTICALLY DEFORMED METAL FILM

(71) Applicant: SAMSUNG ELECTRONICS CO., LTD., Suwon-si (KR)

(72) Inventors: Junghyun Lee, Hwaseong-si (KR); Junghoon Kang, Anyang-si (KR); Hyunchul Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 625 days.

(21) Appl. No.: 17/874,527

(22) Filed: Jul. 27, 2022

(65) Prior Publication Data
US 2023/0082004 A1  Mar. 16, 2023

(30) Foreign Application Priority Data
Sep. 16, 2021 (KR) .......... 10-2021-0124076

(51) Int. Cl.
| | | |
|---|---|---|
| H01L 21/56 | (2006.01) | |
| H01L 23/498 | (2006.01) | |
| H01L 25/10 | (2006.01) | |

(52) U.S. Cl.
CPC ........ *H01L 21/56* (2013.01); *H01L 23/49811* (2013.01); *H01L 23/49866* (2013.01); *H01L 25/105* (2013.01); *H01L 2225/107* (2013.01)

(58) Field of Classification Search
CPC ... H01L 23/32; H01L 21/56; H01L 23/49816; H01L 24/16; H01L 24/48; H01L 2224/12105

USPC .......................................................... 438/106
See application file for complete search history.

(56) References Cited

U.S. PATENT DOCUMENTS

| | | | |
|---|---|---|---|
| 5,925,931 A | | 7/1999 | Yamamoto |
| 2002/0056890 A1* | | 5/2002 | Advocate, Jr. ...... H01L 23/5226 |
| | | | 257/E23.145 |
| 2007/0015351 A1 | | 1/2007 | Tomimori et al. |
| 2008/0153315 A1 | | 6/2008 | Morikazu |
| 2009/0075473 A1 | | 3/2009 | Kim |
| 2013/0267066 A1 | | 10/2013 | Park et al. |
| 2016/0036298 A1 | | 2/2016 | Yamamoto et al. |
| 2019/0150295 A1* | | 5/2019 | Gavagnin ................. H05K 3/32 |
| | | | 361/760 |
| 2020/0051918 A1* | | 2/2020 | Bae ......................... H01L 24/17 |
| 2020/0105673 A1* | | 4/2020 | Alur .................. H01L 23/49894 |

(Continued)

FOREIGN PATENT DOCUMENTS

| | | | |
|---|---|---|---|
| JP | 1998-135270 A | 5/1998 | |
| JP | 2944589 B2 | 9/1999 | |
| JP | 3438586 B2 | 8/2003 | |

(Continued)

*Primary Examiner* — Eliseo Ramos Feliciano
*Assistant Examiner* — Mikka Liu
(74) *Attorney, Agent, or Firm* — Muir Patent Law, PLLC

(57) ABSTRACT

A method for manufacturing a semiconductor package includes forming a pad pattern including a metal film on a semiconductor chip; forming an insulating layer covering the pad pattern and including an organic insulating material; and forming an opening exposing a surface of the metal film of the pad pattern by performing laser processing on the insulating layer, wherein, in forming the opening, a region to be plastically deformed on the metal film by the laser processing is formed.

20 Claims, 15 Drawing Sheets

(56) References Cited

U.S. PATENT DOCUMENTS

2020/0105679 A1* 4/2020 Bae .................. H01L 24/20
2020/0111742 A1* 4/2020 Han .................. H01L 23/3128

FOREIGN PATENT DOCUMENTS

| JP | 2005-28369 A | 2/2005 |
| JP | 2009-200301 A | 9/2009 |
| KR | 1020200038090 A | 4/2020 |
| KR | 1020210104364 A | 8/2021 |

* cited by examiner

SEMICONDUCTOR PACKAGE HAVING PAD PATTERN INCLUDING PLASTICALLY DEFORMED METAL FILM

CROSS-REFERENCE TO RELATED APPLICATION

This application claims benefit of priority to Korean Patent Application No. 10-2021-0124076 filed on Sep. 16, 2021, in the Korean Intellectual Property Office, the disclosure of which is incorporated herein by reference in its entirety.

BACKGROUND

1. Field

Embodiments relate to a semiconductor package and a method for manufacturing the same.

2. Description of the Related Art

A semiconductor package may be mounted on a substrate (e.g., a main board, etc.) through various types of connection bumps (e.g., solder balls). Connection reliability between the semiconductor package and the substrate may be affected by a contact state between a connection bump and a redistribution layer of the semiconductor package.

SUMMARY

According to an embodiment, a method for manufacturing a semiconductor package includes forming a pad pattern including a metal film on a semiconductor chip; forming an insulating layer covering the pad pattern and including an organic insulating material; and forming an opening exposing a surface of the metal film of the pad pattern by performing laser processing on the insulating layer, wherein, in forming the opening, a region to be plastically deformed on the metal film by the laser processing is formed.

According to an embodiment, a method for manufacturing a semiconductor package includes forming a vertical connection structure including an insulating layer and a pad pattern on the insulating layer and having a through-hole; mounting a semiconductor chip in the through-hole of the vertical connection structure; forming an encapsulant encapsulating the semiconductor chip; and forming an opening exposing a surface of the pad pattern by performing laser processing on the encapsulant on the pad pattern, wherein the pad pattern includes a metal layer and a metal film disposed on the metal layer and having a thickness, lower than a thickness of the metal layer, wherein the metal film includes a first region exposed through the opening and crystallized by the laser processing, and a second region surrounding the first region.

According to an embodiment, a method for manufacturing a semiconductor package, includes forming a pad pattern including a first metal layer, a second metal layer, and a third metal layer on a semiconductor chip; forming an insulating layer covering the pad pattern and including an organic insulating material; and forming an opening exposing at least a portion of a surface of the third metal layer of the pad pattern by irradiating a laser beam to the insulating layer, wherein the laser beam has a wavelength of about 343 nm to about 355 nm and a pulse width of nanoseconds or less, and in forming the opening, a region to be plastically deformed on the third metal layer is formed.

According to an embodiment, a semiconductor package includes a semiconductor chip; a pad pattern disposed on the semiconductor chip and including a metal layer and a metal film; an insulating layer disposed on the semiconductor chip and the pad pattern, having an opening exposing a surface of the metal film, and including an epoxy resin and an inorganic filler, wherein a thickness of the metal film is thinner than a thickness of the metal layer, and the metal film includes a region to be plastically deformed by laser processing.

BRIEF DESCRIPTION OF DRAWINGS

Features will become apparent to those of skill in the art by describing in detail example embodiments with reference to the attached drawings in which.

DETAILED DESCRIPTION

Figure 1:
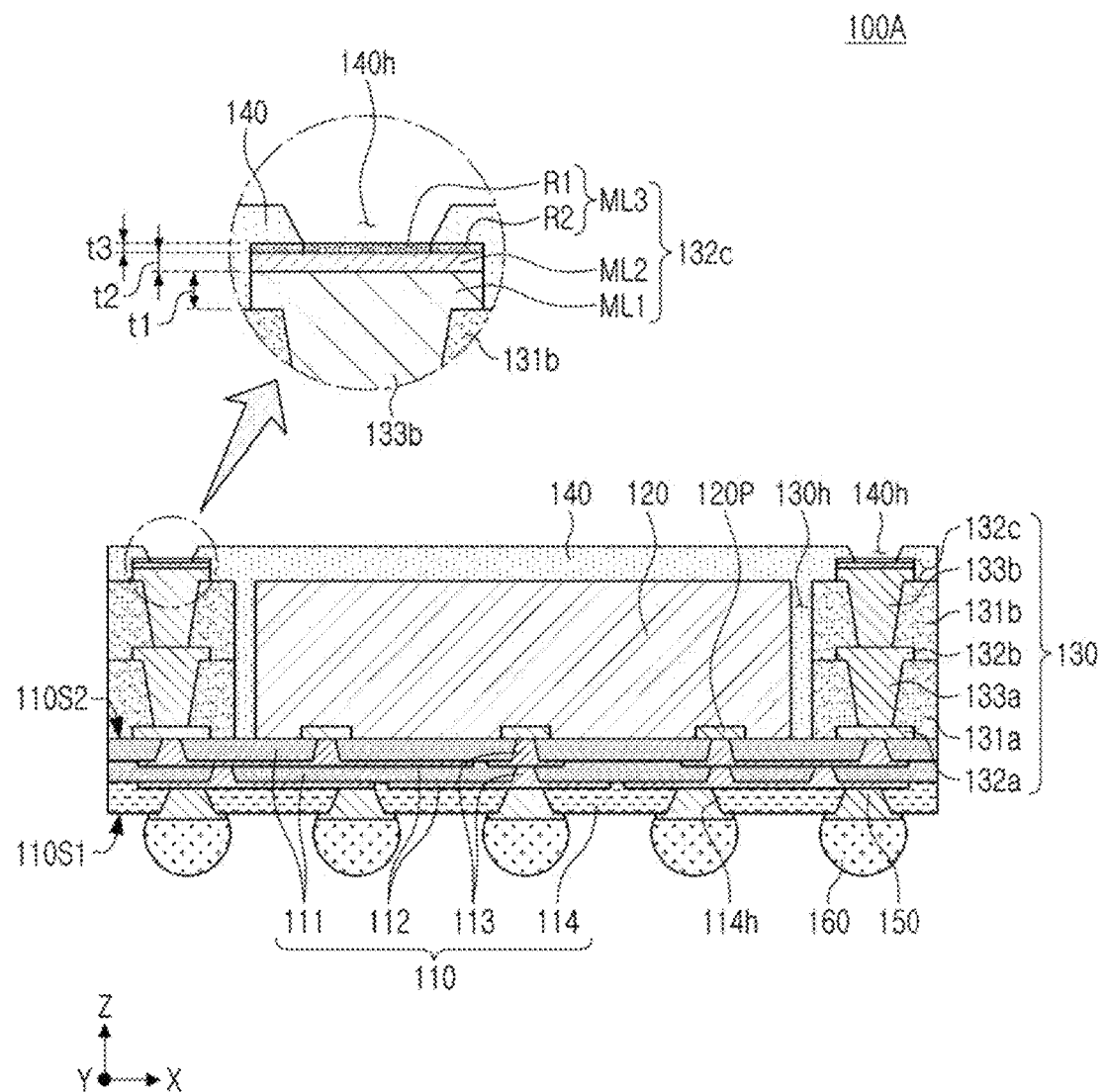
FIG. 1 is a cross-sectional view illustrating a semiconductor package according to example embodiments.
Figure 2:
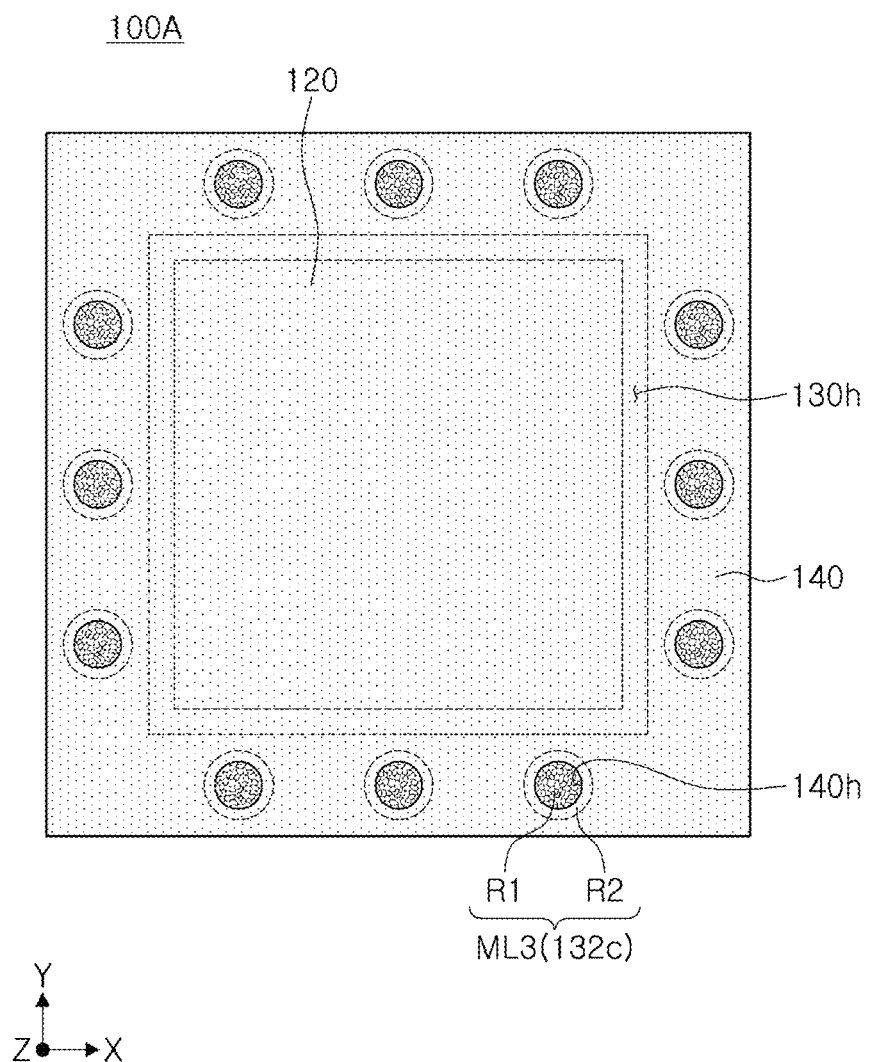
FIG. 2 is a plan view illustrating a semiconductor package according to example embodiments.

FIG. 1 is a cross-sectional view illustrating a semiconductor package according to example embodiments. FIG. 2 is a plan view illustrating a semiconductor package according to example embodiments. FIG. 2 is a plan view of the semiconductor package of FIG. 1, as viewed from above.

Referring to FIGS. 1 to 2, a semiconductor package 100A may include a redistribution substrate 110, a semiconductor chip 120 on the redistribution substrate 110, a vertical connection structure 130 having a through-hole 130h in which the semiconductor chip 120 is accommodated, an encapsulant 140 encapsulating the semiconductor chip 120, an under-bump metal layer 150, and a connection bump 160.

The redistribution substrate 110 may include an insulating layer 111, a redistribution layer 112, a redistribution via 113, and a protective layer 114. The redistribution substrate 110 may have an upper surface 110S2 on which the semiconductor chip 120 is mounted, and a lower surface 110S1 on which the connection bump 160 is disposed and to which a surface of the protective layer 114 is exposed. The redistribution layer 112 may be electrically connected to the semiconductor chip 120.

Although the redistribution layer 112 is illustrated as being directly connected to a connection pad 120P of the semiconductor chip 120 through the redistribution via 113, as in FIG. 1, another connection bump may be disposed between the redistribution layer 112 or the redistribution via 113 and the connection pad 120P.

The insulating layer 111 may include a plurality of insulating layers 111 stacked in a vertical direction (a Z direction). The insulating layer 111 may include an insulating resin. The insulating resin may include a thermosetting resin such as an epoxy resin, a thermoplastic resin such as polyimide, or a resin impregnated with an inorganic filler and/or a glass fiber, a glass cloth, or a glass fabric in these resins, e.g., a prepreg, Ajinomoto Build-up Film (ABF), FR-4, or bismaleimide triazine (BT). The insulating layer 111 may include a photosensitive resin such as a photoimageable dielectric (PID) resin, and, in this case, the insulating layer 111 may be formed to be thinner, and the redistribution layer 112 and the redistribution via 113, having a fine pitch, may be formed. Depending on a process, boundaries between insulating layers 111 having different levels may be unclear.

The redistribution layer 112 may be disposed on the insulating layer 111. The redistribution layer 112 may include a plurality of redistribution layers 112 having different levels, and may be electrically connected to each other through the redistribution vias 113 passing through the insulating layer 111. The redistribution layer 112 may redistribute the connection pad 120P of the semiconductor chip 120. The redistribution layer 112 may include, e.g., a metal material including copper (Cu), aluminum (Al), silver (Ag), tin (Sn), gold (Au), nickel (Ni), lead (Pb), titanium (Ti), or alloys thereof. The redistribution layer 112 may perform various functions according to a given design. For example, a ground (GND) pattern, a power (PWR) pattern, and a signal (S) pattern may be included. The signal (S) pattern may provide a transmission path for various signals (other than the ground (GND) pattern and the power (PWR) pattern), e.g., a data signal or the like.

The redistribution via 113 may pass through the insulating layer 111 to electrically connect the plurality of redistribution layers 112 located on different levels. The redistribution via 113 may include a signal via, a ground via, and a power via. The redistribution via 113 may include, e.g., a metal material including copper (Cu), aluminum (Al), silver (Ag), tin (Sn), gold (Au), nickel (Ni), lead (Pb), titanium (Ti), or alloys thereof. The redistribution via 113 may formed as a filled via in which a metal material is filled in a via hole, or a conformal via in which a metal material is formed along an inner wall of a via hole.

The protective layer 114 may be disposed to be opposite to the upper surface 110S2 of the redistribution substrate 110 on which the semiconductor chip 120 is mounted, and may have an opening 114h exposing a portion of a pad 112 among the redistribution layers 112. The under-bump metal layer 150 may be disposed in the opening 114h of the protective layer 114, and the connection bump 160 may be disposed below the under-bump metal layer 150. The protective layer 114 may protect the pad 112 among the redistribution layers 112 from an external environment. The protective layer 114 may include a thermosetting resin such as an epoxy resin, a thermoplastic resin such as polyimide, or a resin impregnated with an inorganic filler and/or a glass fiber, a glass cloth, or a glass fabric in these resins, e.g., a prepreg, ABF, FR-4, or BT. In consideration of the functional properties of being exposed externally of the package and protecting the pad 112 among the redistribution layers 112 and the connection bump 160, the protective layer 114 may include an insulating resin having excellent heat resistance, flame retardancy, or the like. For example, the protective layer 114 may include a non-photosensitive resin impregnated with an inorganic filler.

The semiconductor chip 120 may include a connection pad 120P disposed on the upper surface 110S2 of the redistribution substrate 110 and electrically connected to the redistribution layer 112. The connection pad 120P may include, e.g., a metal material such as aluminum (Al) or the like. The semiconductor chip 120 may have a structure directly connected to the redistribution via 113 of the redistribution substrate 110 in a chip-first method, e.g., or it may be mounted on the redistribution substrate 110 in a chip-last method. The semiconductor chip 120 may be mounted in a flip-chip bonding method using a separate connection member having a land shape, a ball shape, or a pin shape. In another implementation, the semiconductor chip 120 may be mounted using a wire bonding method.

The semiconductor chip 120 may be, e.g., a logic chip or a memory chip. The logic chip may include, e.g., a central processing unit (CPU), a graphics processing unit (GPU), a field programmable gate array (FPGA), a digital signal processing unit (DSP), a cryptographic processor, a microprocessor, a microcontroller, an analog-to-digital converter, an application-specific integrated circuit (ASIC), or the like. The memory chip may include, e.g., a volatile memory device such as a dynamic RAM (DRAM), a static RAM (SRAM), or the like, or a nonvolatile memory device such as a phase change RAM (PRAM), a magnetic RAM (MRAM), a resistive RAM (RRAM), a flash memory, or the like.

The vertical connection structure 130 may be disposed on the redistribution substrate 110. The semiconductor chip 120 may be disposed in the through-hole 130h such that a surface of the semiconductor chip 120 on which the connection pad 120P is disposed faces the upper surface 110S2 of the redistribution substrate 110. The through-hole 130h may have a wall surface surrounding the semiconductor chip 120. The vertical connection structure 130 may include a plurality of insulating layers, e.g., a first insulating layer 131a and a second insulating layer 131b, a plurality of wiring layers, e.g., a first wiring layer 132a, a second wiring layer 132b, and a third wiring layer 132c, and a plurality of wiring vias, e.g., a first wiring via 133a and a second wiring via 133b. The vertical connection structure 130 may further improve rigidity of the package, depending on materials of the first and second insulating layers 131a and 131b, and may improve thickness uniformity of the encapsulant 140. The vertical connection structure 130 may include a first wiring layer 132a disposed on the upper surface 110S2 of the redistribution substrate 110, a first insulating layer 131a covering the first wiring layer 132a, a second wiring layer 132b disposed on the first insulating layer 131a to oppose the first wiring layer 132a, a first wiring via 133a passing through the first insulating layer 131a to connect the first wiring layer 132a and the second wiring layer 132b, a second insulating layer 131b covering the second wiring layer 132b, a third wiring layer 132c disposed on the second insulating layer 131b, and a second wiring via 133b passing through the second insulating layer 131b to connect the second wiring layer 132b and the third wiring layer 132c.

The first and second insulating layers 131a and 131b may include an insulating material, and the insulating material may include a thermosetting resin such as an epoxy resin, a thermoplastic resin such as polyimide, or a resin impregnated with an inorganic filler and/or a glass fiber, a glass cloth, or a glass fabric in these resins, e.g., a prepreg, ABF, FR-4, BT, or the like.

The wiring layers 132a, 132b, and 132c may be electrically connected to the redistribution layer 112 of the redistribution substrate 110, and may provide an electricity connection path passing from at least one side of the semiconductor chip 120 in a vertical direction, together with the wiring via 133. The wiring layers 132a, 132b, and 132c may include a metal material such as copper (Cu), aluminum (Al), silver (Ag), tin (Sn), gold (Au), nickel (Ni), lead (Pb), titanium (Ti), or alloys thereof.

Among the wiring layers 132a, 132b, and 132c, the third wiring layer 132c may be disposed on the first and second insulating layers 131a and 131b, and may be disposed on an uppermost portion of the vertical connection structure 130, and may be referred to as a 'pad pattern' 132c.

The wiring vias 133a and 133b may electrically connect the wiring layers 132a, 132b and 132c, formed as different layers, to each other, and as a result, an electrical path may be formed in the vertical connection structure 130. The wiring vias 133a and 133b may include copper (Cu), aluminum (Al), silver (Ag), tin (Sn), gold (Au), nickel (Ni), lead (Pb), titanium (Ti), or alloys thereof. The wiring vias 133a and 133b may be filled vias in which a metal material is completely filled in a via hole, or conformal vias in which a metal material is formed along a wall surface of a via hole.

The encapsulant 140 may be disposed on the upper surface 110S2 of the redistribution substrate 110, and may cover at least a portion of the semiconductor chip 120. The encapsulant 140 may extend to cover an upper surface of the vertical connection structure 130.

The encapsulant 140 may include an insulating material, e.g., a thermosetting resin such as an epoxy resin, a thermoplastic resin such as polyimide, or a prepreg including an inorganic filler and/or a glass fiber, ABF, FR-4, BT, an epoxy molding compound (EMC), or the like.

A portion of a surface of the pad pattern 132c (i.e., the third wiring layer) may be covered by the encapsulant 140. The surface of the pad pattern 132c may be roughened (e.g., CZ-treated or copper zarazara-treated) to improve adhesion thereof to the encapsulant 140.

A portion of the surface of the pad pattern 132c (i.e., the third wiring layer) may be exposed by forming an opening 140h in the encapsulant 140.

For example, according to an example embodiment, the opening 140h of the encapsulant 140 may be formed using a laser beam under specific conditions, to remove smearing remaining on an inner wall of the opening 140h and the pad pattern 132c, with the formation of the opening 140h. Thus, the pad pattern 132c may have a smear-less structure. The smear-less structure may mean that a residue formed while a portion of the encapsulant 140 is removed by laser processing does not remain on a surface of the pad pattern 132c.

The laser processing may be performed under conditions in which only a surface or an internal structure of the pad pattern 132c is changed, without removing the pad pattern 132c or reducing a thickness thereof.

The pad pattern 132c may include a first metal layer ML1 integrally formed with the wiring via 133b, a second metal layer ML2 on the first metal layer ML1, and a third metal layer ML3 on the second metal layer ML2. The second metal layer ML2 may be disposed between the first metal layer ML1 and the third metal layer ML3.

A laser beam used for the laser processing may be partially absorbed through a surface of the third metal layer ML3 forming a metal film.

In an example embodiment, the first metal layer ML1 may include copper (Cu), and may include a barrier layer of titanium (Ti)/titanium nitride (TiN).

In an example embodiment, the second metal layer ML2 may include nickel (Ni).

In an example embodiment, the third metal layer ML3 may include gold (Au).

Metal materials forming the first to third metal layers ML1, ML2, and ML3 may vary and may include other metal materials.

In an example embodiment, a thickness t3 of the third metal layer ML3 may be smaller than a thickness t1 of the first metal layer ML1 and a thickness t2 of the second metal layer ML2. For example, the thickness t1 of the first metal layer ML1 may be about 2 µm to about 10 the thickness t2 of the second metal layer ML2 may be about 2 µm to about 5 and the thickness t3 of the third metal layer ML3 may be about 200 nm to about 500 nm.

In an example embodiment, the third metal layer ML3 (a metal film) may include a first region R1 exposed through the opening 140h of the encapsulant 140 and a second region R2 surrounding the first region R1. The first region R1 may be a region in which plastic deformation occurs due to a thermal reaction by the laser processing. For example, the first region R1 may be changed from an isotropic single crystal structure to an anisotropic polycrystalline structure by the laser processing. The second region R2 may have an isotropic single crystal structure. Before the laser processing, the third metal layer ML3 may have a single crystal face-centered cubic (FCC) crystal structure. The metal film ML3 may be plastically deformed to increase dislocation density. For example, in the third metal layer ML3, a dislocation density of the first region R1 may be higher than a dislocation density of the second region R2.

According to an example embodiment, smearing on the surface of the third metal layer ML3 exposed through the opening 140h may be removed to improve connection reliability between the pad pattern 132c and a connection bump that is subsequently disposed on the pad pattern 132c. In addition, a chemical desmearing process may be omitted, which may help prevent problems due to chemical solutions (e.g., discoloration of the encapsulant, peeling of the protective layer, or the like) and simplify a process for manufacturing the package.

Properties of a metal film according to surface treatment of the third metal layer ML3 will be further described with reference to FIGS. 3A to 4E below.

The under-bump metal layer 150 may be disposed on the connection bump 160 to improve connection reliability of the connection bump 160. For example, the under-bump metal layer 150 may improve board level reliability of the semiconductor package 100A according to this embodiment. The under-bump metal layer 150 may include a metal material including copper (Cu), aluminum (Al), silver (Ag), tin (Sn), gold (Au), nickel (Ni), lead (Pb), titanium (Ti), or alloys thereof. There may be tens to tens of thousands of under-bump metal layers 150. Each of the under-bump metal layers 150 may be connected to the redistribution layer 112 through the opening 114h passing through the protective layer 114.

The connection bump 160 may be configured to physically and/or electrically connect the semiconductor package 100A to an external device. For example, the semiconductor package 100A may be mounted on a main board of an electronic device through the connection bump 160. The connection bump 160 may include a low melting point metal, e.g., tin (Sn) or an alloy including tin (Sn) (e.g., Sn—Ag—Cu). The connection bump 160 may include, e.g., a solder ball. The connection bump 160 may have a land shape, a ball shape, or a pin shape. The connection bump 160 may be formed as a multilayer or a single layer structure. When the connection bump 160 is formed as a multilayer structure, the connection bump 160 may include a copper pillar and a solder. When the connection bump 160 is formed as a single layer structure, the connection bump 160 may include a tin-silver solder or copper.

Figure 3A:
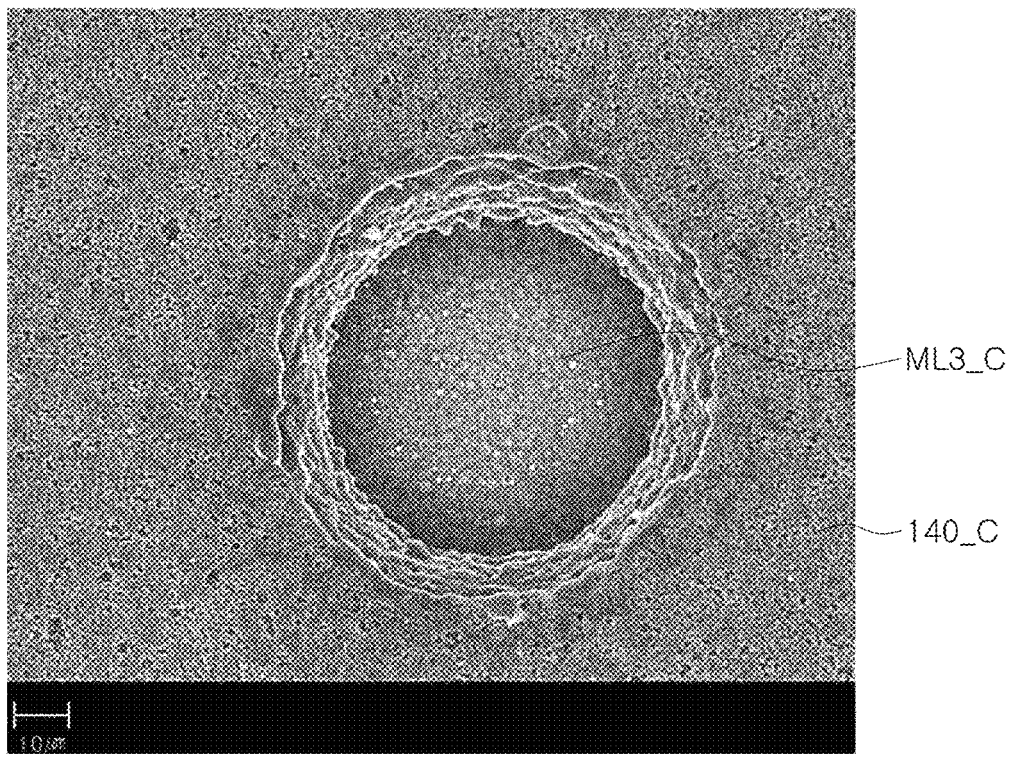
FIGS. 3A to 3C are scanning electron microscope (SEM) images illustrating a pad pattern of a semiconductor package according to a comparative example.
Figure 3B:
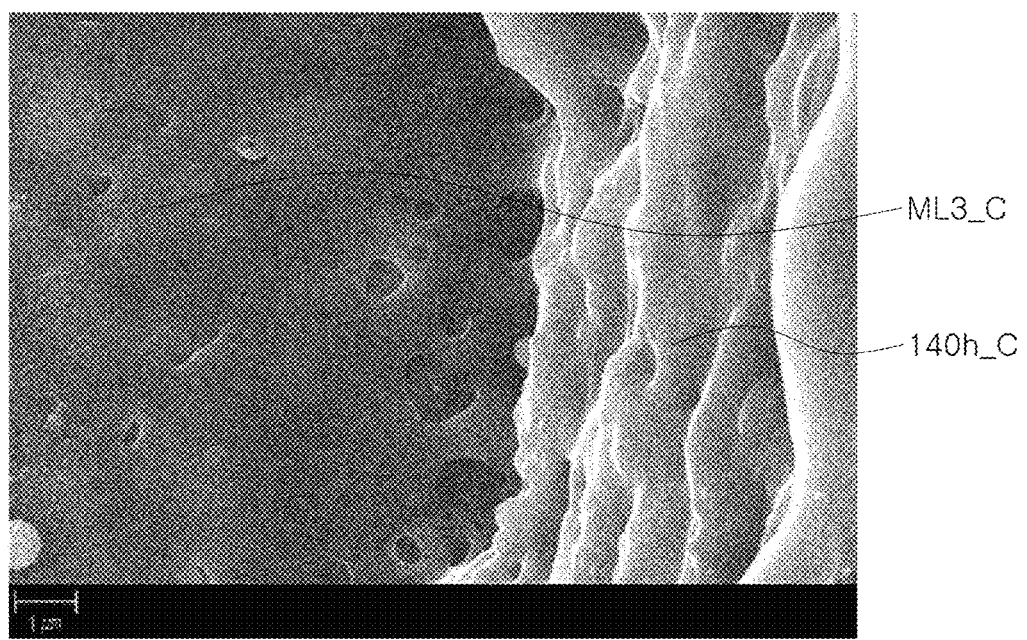
Figure 3C:
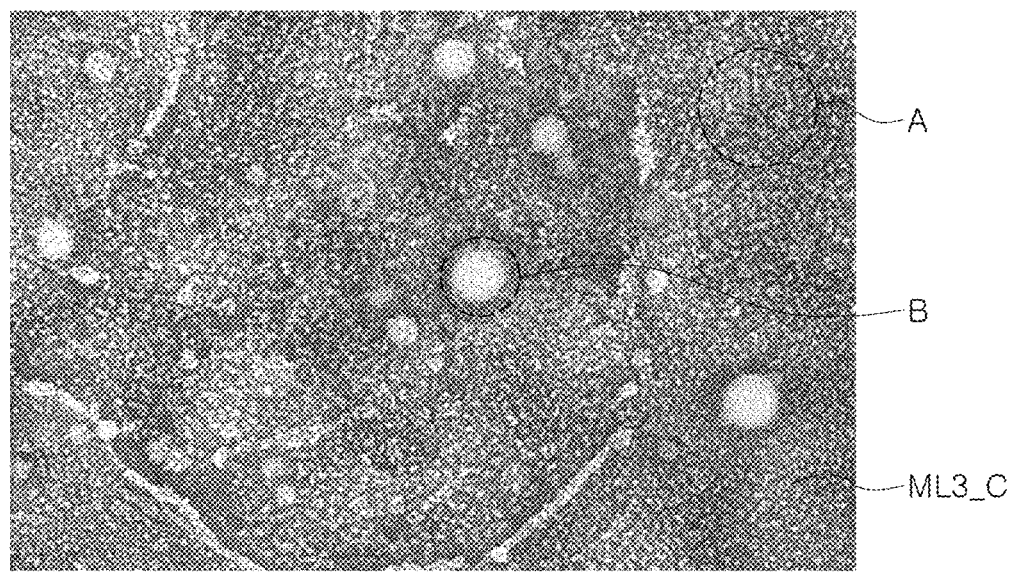
Figure 3D:
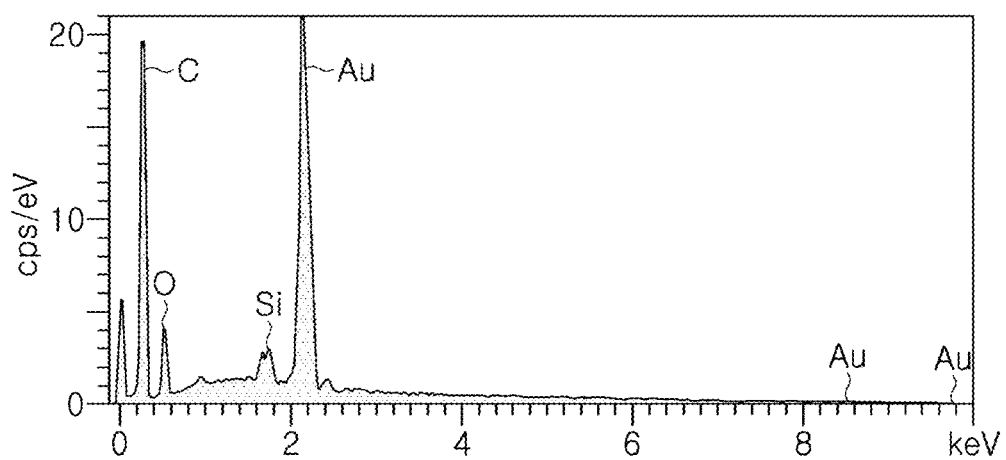
FIG. 3D is a graph illustrating a result of elemental element analysis of a surface of a pad pattern of a semiconductor package according to a comparative example.

FIGS. 3A to 3C are scanning electron microscope (SEM) images illustrating a pad pattern of a semiconductor package according to a comparative example. FIG. 3B is an enlarged view of an edge region of a metal film ML3_C of a pad pattern of FIG. 3A. FIG. 3C is an enlarged view of an intermediate region of the metal film ML3_C of a pad pattern of FIG. 3A. FIG. 3D is a graph illustrating a result of elemental element analysis of a surface of a pad pattern of a semiconductor package according to a comparative example. Energy dispersive X-ray spectroscopy (EDX) was used for elemental analysis.

The comparative example of FIGS. 3A to 3D used a laser having a long wavelength (e.g., a wavelength of about 9.4 μm, a wavelength of a CO$_2$ laser, or a wavelength of a YAG laser) having a low absorption rate for the metal layer, and corresponded to a case in which an opening 140h_C was formed in an encapsulant 140_C by a thermal reaction.

It can be seen that a residue of a resin and a residue of a filler, formed during the thermal reaction of the encapsulant 140_C, remained as fine grains or particles on a surface of a metal film ML3_C exposed through the opening 140h C. For example, in FIG. 3C, it can be seen that a residue of the resin was fixed to a region marked as 'A' and a surface was discolored, and a residue of the filler remained as grains or particles in a region marked as 'B.' As a result, connection reliability between the metal film ML3_C and a connection bump was reduced, and thus reliability of a semiconductor package was deteriorated. In FIG. 3D, it can be seen that, on the surface of the metal film ML3_C, a carbon (C) element and an oxygen (O) element, along with a gold (Au) element, were detected in relatively large amounts, compared to that of FIG. 4E (discussed below).

Figure 4A:
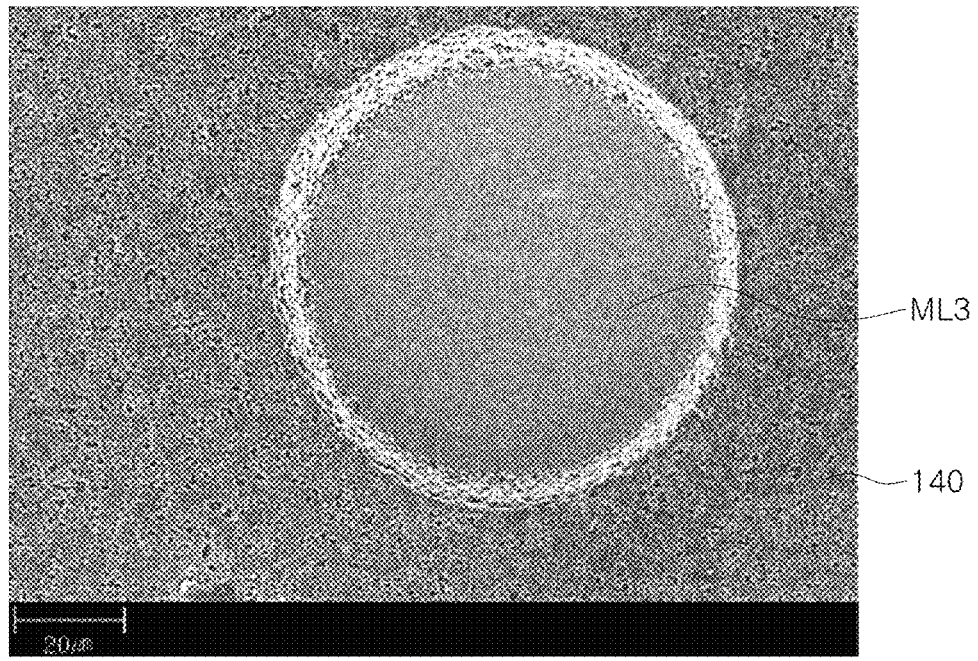
FIGS. 4A to 4D are scanning electron microscope (SEM) images illustrating pad patterns of a semiconductor package according to an inventive example.
Figure 4B:
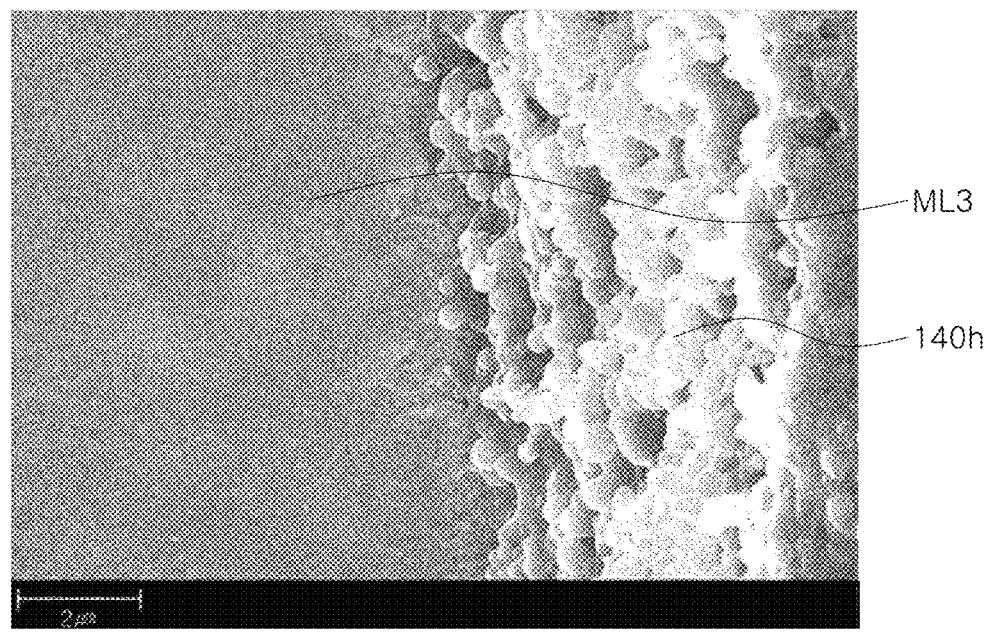
Figure 4C:
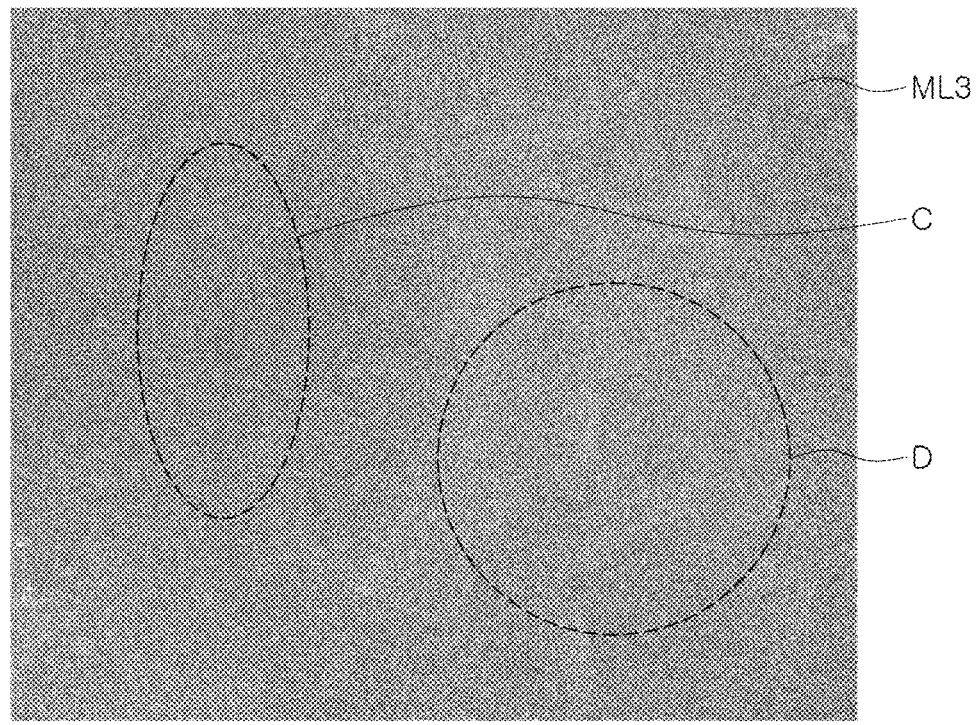
Figure 4D:
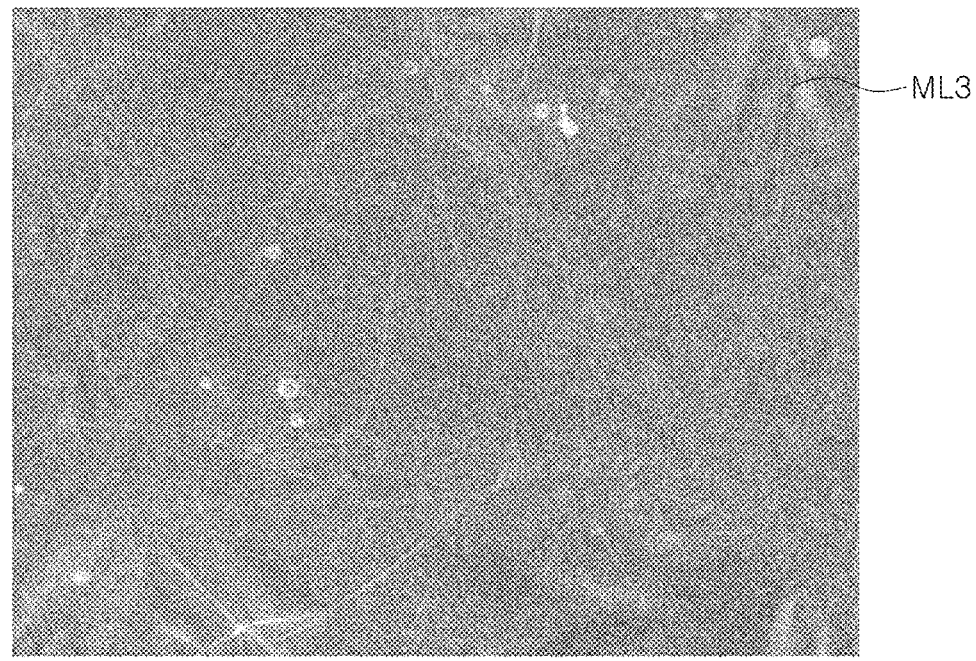
Figure 4E:
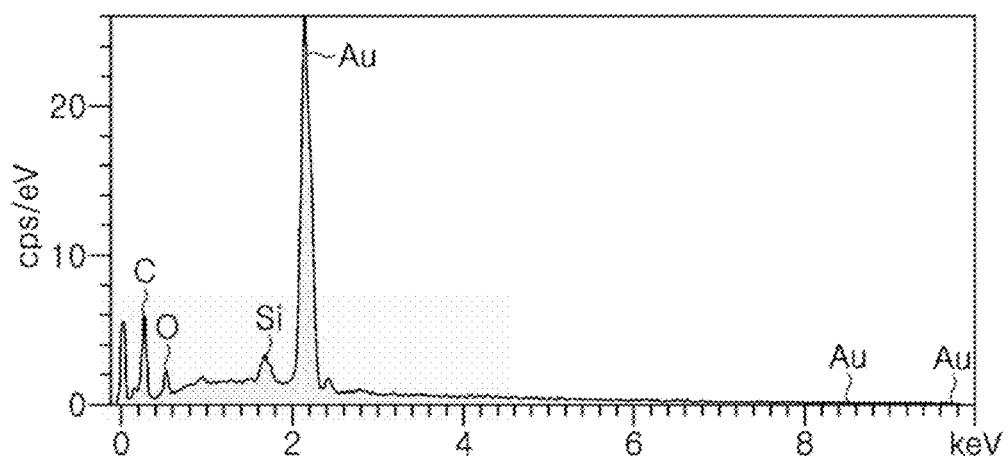
FIG. 4E is a graph illustrating a result of elemental element analysis of a surface of a pad pattern of a semiconductor package according to an inventive example.

FIGS. 4A to 4D are scanning electron microscope (SEM) images illustrating pad patterns of a semiconductor package according to an inventive example. FIG. 4B is an enlarged view of an edge region of a metal film ML3 of a pad pattern of FIG. 4A. FIG. 4C is an enlarged view of an intermediate region of a metal film ML3 of a pad pattern of FIG. 4A. FIG. 4E is a graph illustrating a result of elemental element analysis of a surface of a pad pattern of a semiconductor package according to an inventive example. Energy dispersive X-ray spectroscopy (EDX) was used for the elemental analysis.

Referring to FIGS. 4A to 4E, it can be seen that a first region R1 of a metal film ML3 was plastically deformed by laser processing. By the laser processing, a CZ-treated surface of the metal film ML3 was changed to be smooth, and a residue of a resin and a residue of a filler were removed. Therefore, it was possible to improve connection reliability between a pad pattern and a connection bump, and to omit a subsequent chemical desmearing process, to prevent problems caused by chemical solutions (e.g., discoloration of an encapsulant, peeling of the protective layer, or the like), and simplify a process for manufacturing a package. By the laser processing, the metal film ML3 was crystallized on a surface thereof to change from an isotropic single crystal structure to an anisotropic polycrystalline structure.

In a region of the surface of the metal film ML3, a mixed dislocation, e.g., a mixed dislocation in a 'Y' shape, such as a region indicated as 'C' in FIG. 4C may appear. Various types of mixed dislocations may be formed in a region of a surface of the metal film ML3 as shown in FIG. 4E. The region of the surface of the metal film ML3 may have a polygonal (e.g., turtle carapace) crystal grain structure, such as a region indicated as 'D' in FIG. 4C.

In FIG. 4E, it can be seen that a carbon (C) element and an oxygen (O) element constituting the residue, along with a gold (Au) element, on a surface of the metal film ML3 were detected in relatively small amounts, compared to FIG. 3D.

As demonstrated by the above, example embodiments may remove smearing on a surface of the metal film ML3 to improve connection reliability between the pad pattern 132c and a connection bump formed on the pad pattern 132c.

Figure 5:
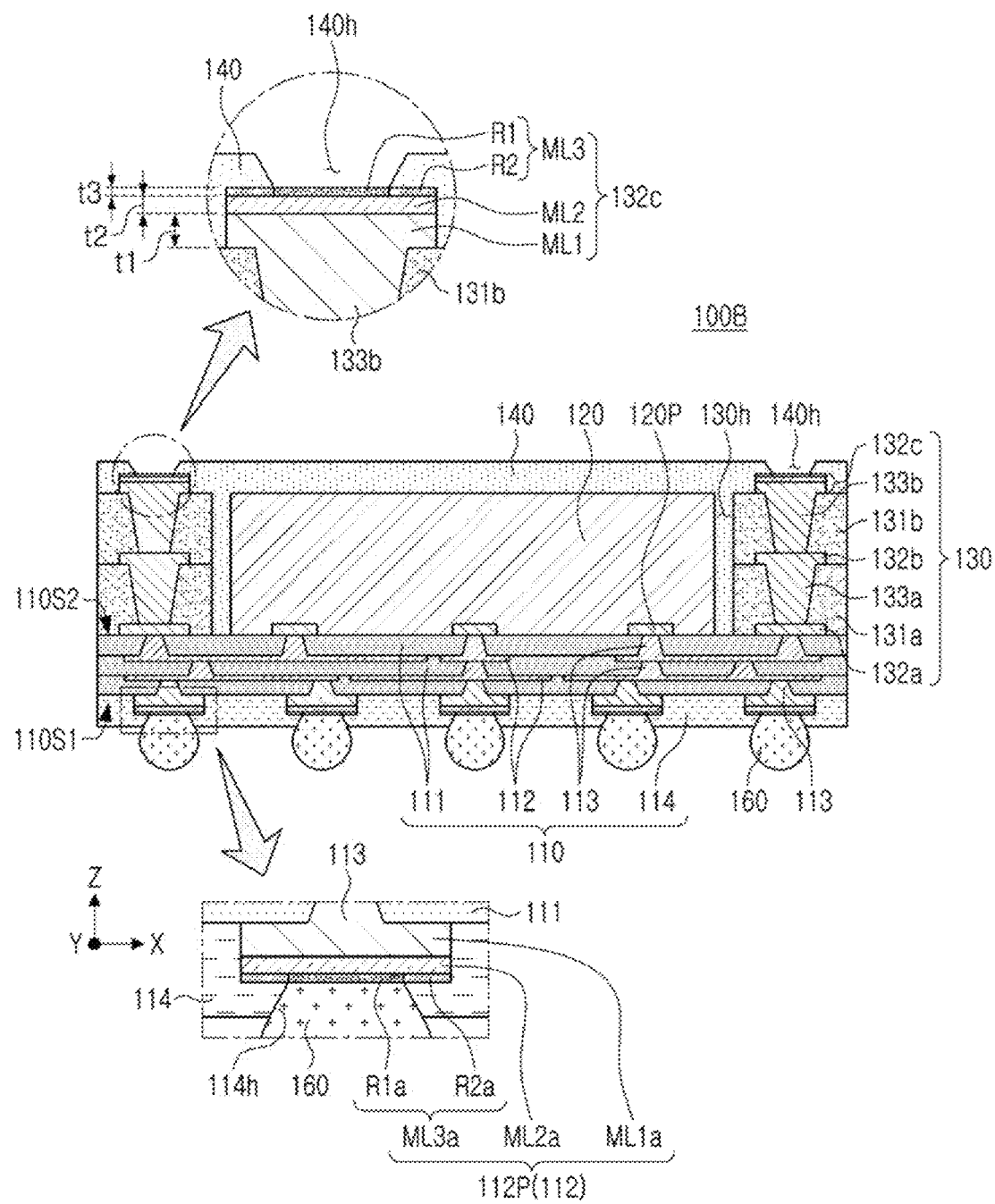
FIG. 5 is a cross-sectional view illustrating a semiconductor package according to example embodiments.

FIG. 5 is a cross-sectional view illustrating a semiconductor package according to example embodiments.

Referring to FIG. 5, a semiconductor package 100B may have similar characteristics to the semiconductor package 100A of FIG. 1, except that a redistribution pad 112P exposed through the opening 114h formed in the protective layer 114 of the redistribution substrate 110 includes a first metal layer ML1a, a second metal layer ML2a, and a third metal layer ML3a, wherein the third metal layer ML3a includes a first region R1a plastically deformed by laser processing, and a second region R2a surrounding the first region R1a. When the opening 114h is formed in the protective layer 114 by the laser processing, residues due to fillers and resins may be removed from a surface of the redistribution pad 112P located on an outermost side of the redistribution layers 112.

Figure 6:
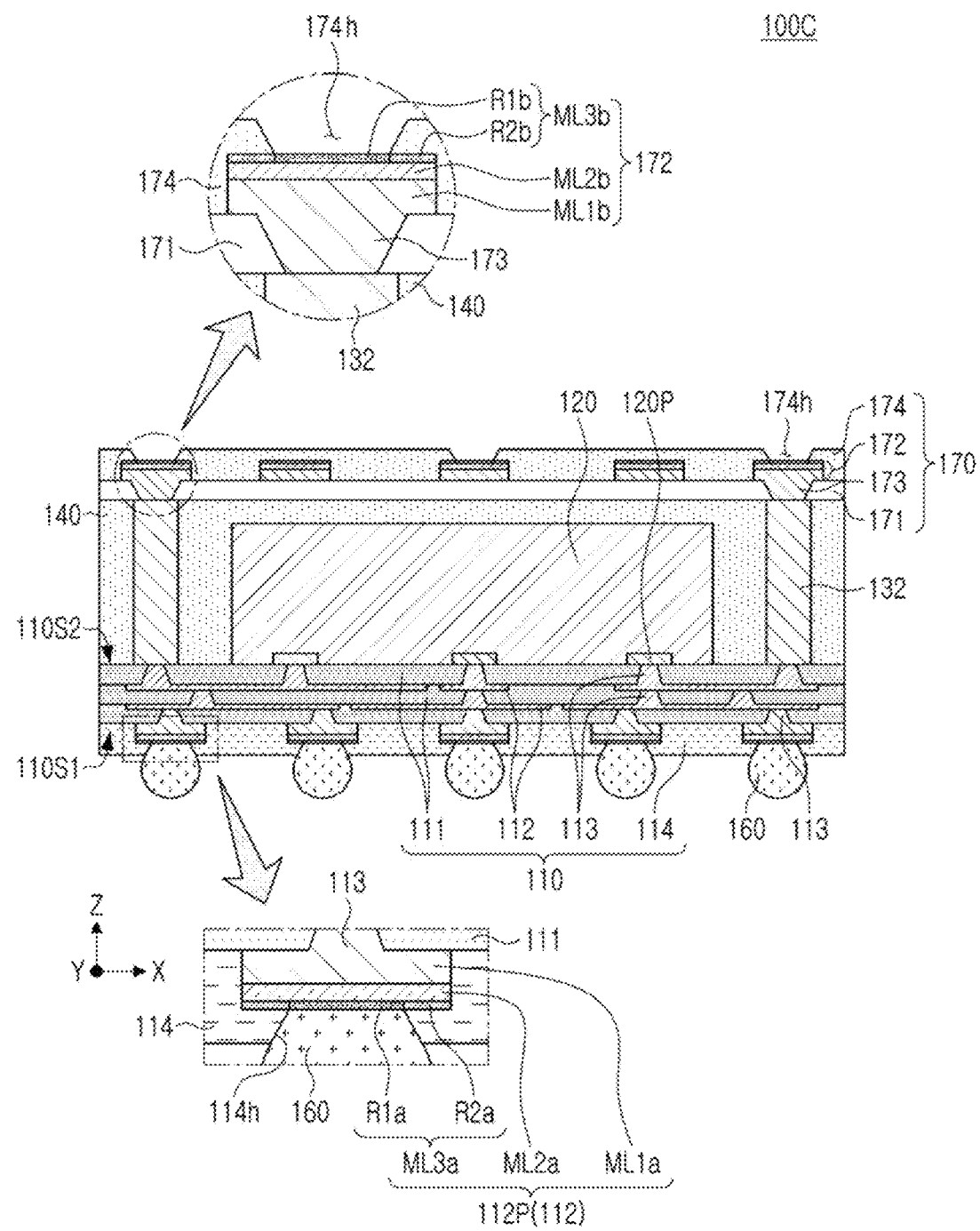
FIG. 6 is a cross-sectional view illustrating a semiconductor package according to example embodiments.

FIG. 6 is a cross-sectional view illustrating a semiconductor package according to example embodiments.

Referring to FIG. 6, a semiconductor package 100C may include a through-via 132, instead of a vertical connection structure 130, and may further include a rear redistribution structure 170 disposed on the through-via 132. The rear redistribution structure 170 may further include a rear insulating layer 171, a rear redistribution layer 172, a rear redistribution via 173, and a rear protective layer 174. The through-via 132 may have a shape in which a conductive post passes through at least a portion of an encapsulant 140. The through-via 132 may be connected to the redistribution layer 112 in a lower portion of the semiconductor package 100C, and may be connected to the rear redistribution layer 172 in an upper portion of the semiconductor package 100C, to provide an electrical connection path in the semiconductor package 100C in a vertical direction. The rear insulating layer 171 may include an insulating resin, similar to that of the encapsulant 140 and that of the insulating layer 111, e.g., a photosensitive resin. The rear protective layer 174 may include an opening 174h, and the rear redistribution layer 172 exposed through the opening 174h may include a first metal layer ML1b, a second metal layer ML2b, and a third metal layer ML3b, as described above with reference to FIG. 1, wherein the third metal layer ML3b may include a first region R1b plastically deformed by laser processing and a second region R2b surrounding the first region R1b. The rear protective layer 174 may include an insulating resin, similar to that of the encapsulant 140, e.g., ABF.

Figure 7:
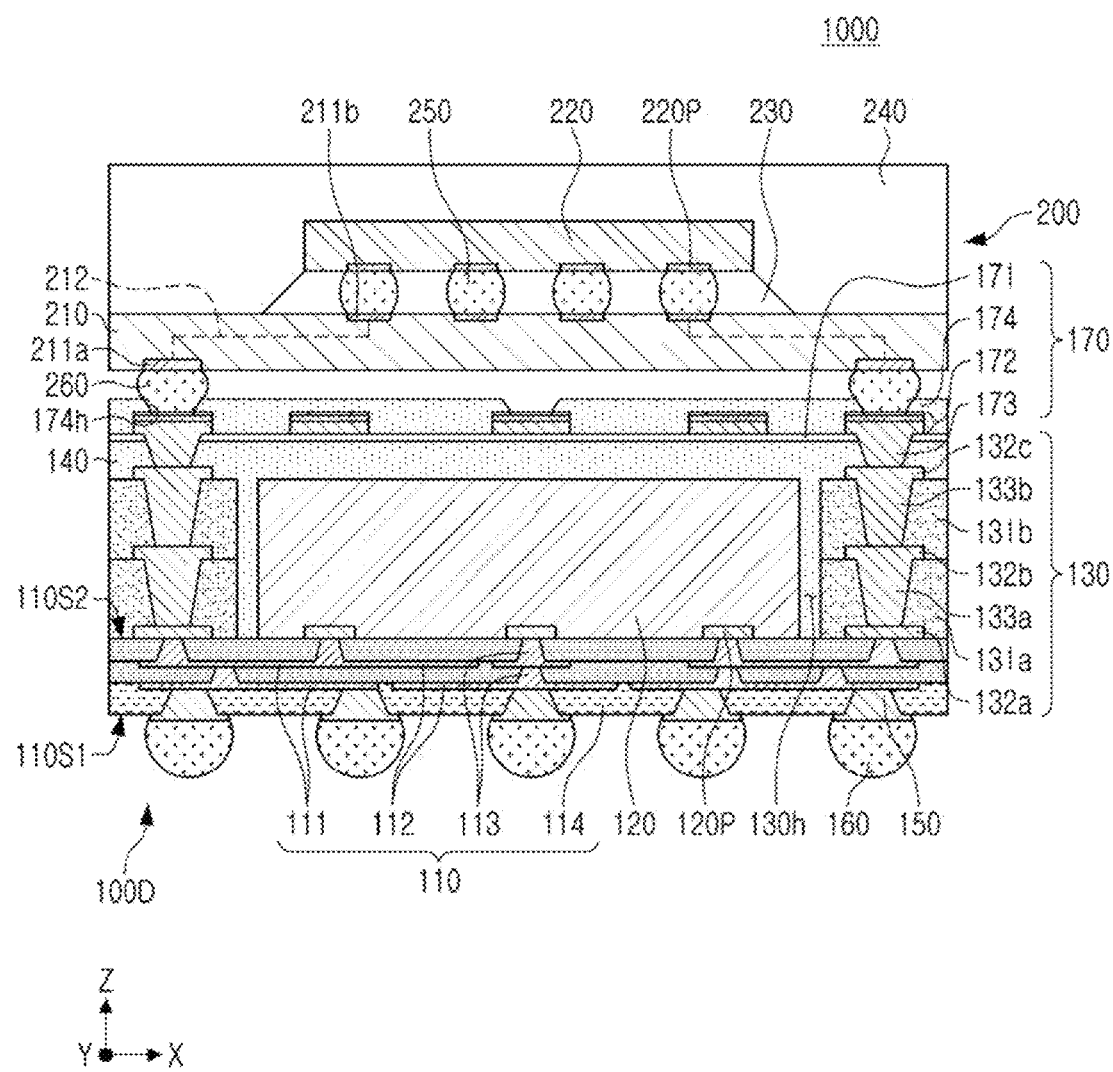
FIG. 7 is a cross-sectional view illustrating a semiconductor package according to example embodiments.

FIG. 7 is a cross-sectional view illustrating a semiconductor package according to example embodiments.

Referring to FIG. 7, a semiconductor package 1000 may include a first package 100D and a second package 200, coupled in a package-on-package form.

The first package 100D may include the redistribution substrate 110 as a first redistribution substrate, the semiconductor chip 120 as a first semiconductor chip, a vertical connection structure 130, and the encapsulant 140 as a first encapsulant, and may have similar characteristics to the semiconductor package 100A of FIG. 1, except that a rear redistribution structure 170 is further included and the rear redistribution layer 172 exposed through the opening 174h includes first to third metal layers ML1, ML2, and ML3. However, the first package 100D may have similar characteristics to the semiconductor package 100B of FIG. 5 and the semiconductor package 100C of FIG. 6.

The rear redistribution structure 170 may include the rear insulating layer 171, the rear redistribution layer 172 on the rear insulating layer 171, the rear redistribution via 173 passing through the rear insulating layer 171 to connect the rear redistribution layer 172 and the wiring layer 132c of the vertical connection structure 130, and the rear protective layer 174. The rear insulating layer 171 may be disposed on an upper surface of the first encapsulant 140. The rear insulating layer 171 may include an insulating resin, similar to that of an insulating layer 111 of the redistribution substrate 110, e.g., a photosensitive resin. The rear redistribution layer 172 and the rear redistribution via 173 may include a conductive material, similar to that of a redistribution layer 112 and that of the redistribution via 113 of the redistribution substrate 110. The rear protective layer 174 may include an insulating resin, similar to that of the protective layer 114, e.g., ABF.

The second package 200 may include a second redistribution substrate 210, a second semiconductor chip 220, and a second encapsulant 240. The second redistribution substrate 210 may include redistribution pads 211a and 211b electrically connected to an external source, respectively, on upper and lower surfaces thereof. Also, the second redistribution substrate 210 may include a redistribution circuit 212 connected to the redistribution pads 211a and 211b therein. The redistribution circuit 212 may redistribute a connection pad 220P of the second semiconductor chip 220 to a fan-out region.

The second semiconductor chip 220 may include a connection pad 220P connected to an internal integrated circuit, and the connection pad 220P may be electrically connected to the second redistribution substrate 210 through a connection member 250. The connection member 250 may include conductive bumps or conductive wires. For example, the connection member 250 may be a solder ball. An underfill resin 230 may be disposed between the second redistribution substrate 210 and the second semiconductor chip 220, and may surround a side surface of the connection member 250. The underfill resin 230 may include an insulating resin such as an epoxy resin or the like. The underfill resin 230 may be a portion of the second encapsulant 240 formed by a molded under-fill (MUF) method. The second semiconductor chip 220 may be disposed on the second redistribution substrate 210, and may be electrically connected to the redistribution pads 211a and 211b and the redistribution circuit 212. In a modified example, the connection pad 220P of the second semiconductor chip 220 may be in direct contact with the upper surface of the second redistribution substrate 210, and may be electrically connected to the redistribution circuit 212 through a via in the second redistribution substrate 210.

The second encapsulant 240 may include a material, identical to or similar to that of the first encapsulant 140 of the first package 100D. The second package 200 may be physically and electrically connected to the first package 100D by a metal bump 260. The metal bump 260 may be electrically connected to the redistribution circuit 212 in the second redistribution substrate 210 through the redistribution pad 211a on the lower surface of the second redistribution substrate 210. The metal bump 260 may be formed of a low-melting-point metal, e.g., tin (Sn) or an alloy including tin (Sn).

Figure 8:
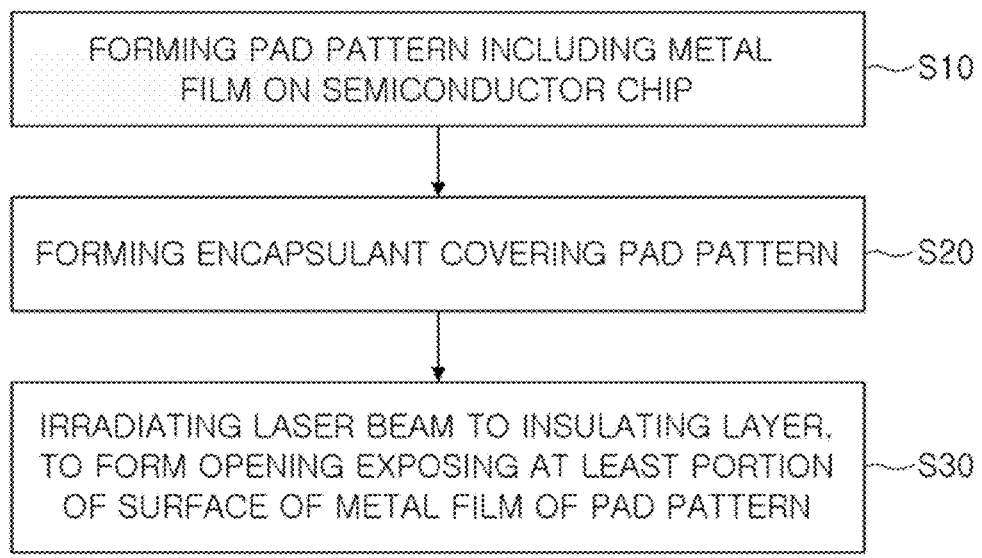
FIG. 8 is a flowchart illustrating a method of manufacturing a semiconductor package according to example embodiments.

FIG. 8 is a flowchart illustrating a method of manufacturing a semiconductor package according to example embodiments.

Figure 9A:
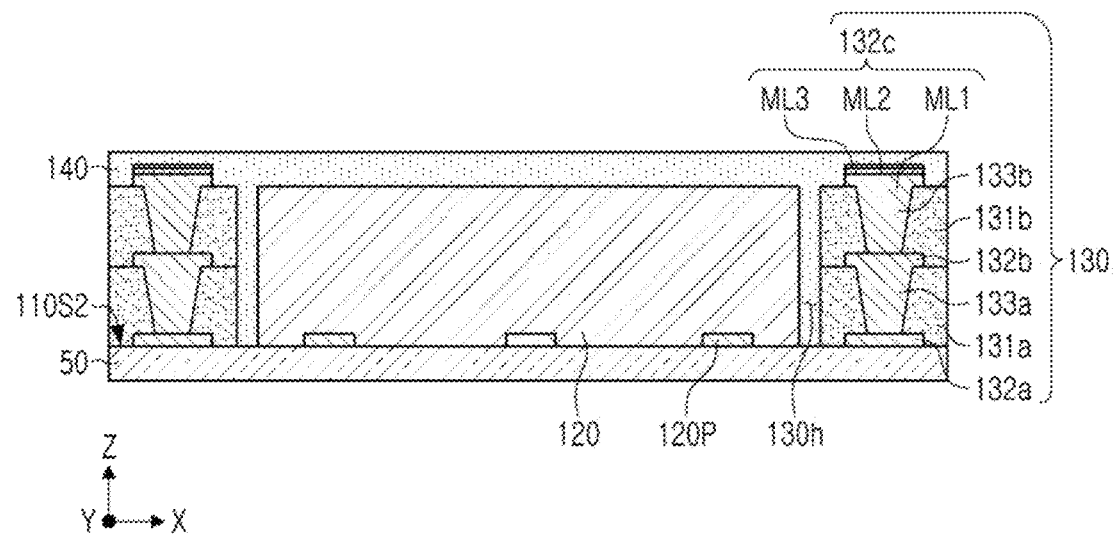
FIGS. 9A to 9C are views illustrating a process sequence to illustrate a method of manufacturing a semiconductor package according to example embodiments.
Figure 9B:
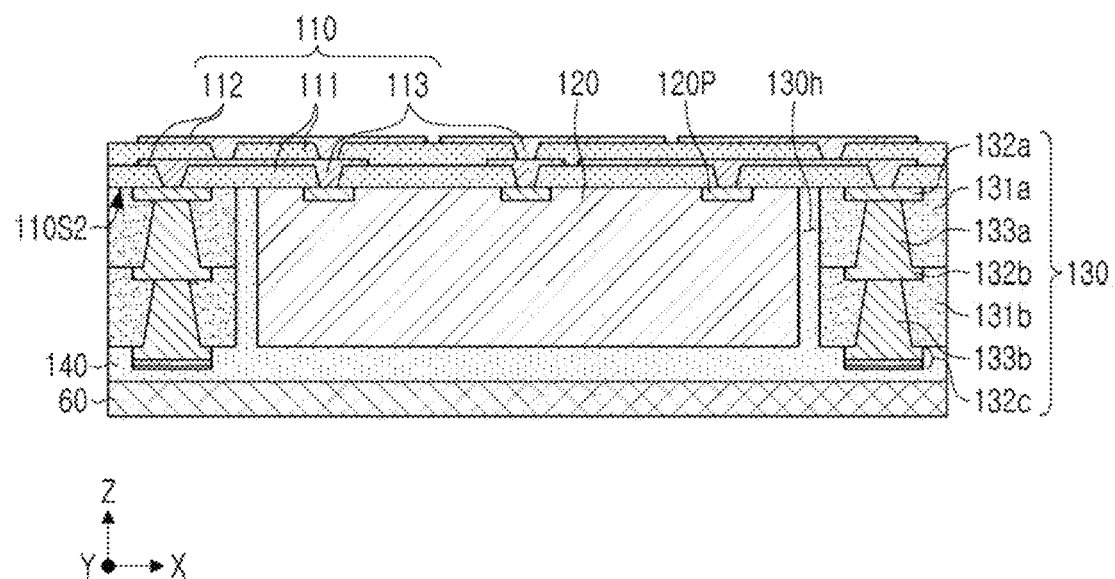
Figure 9C:
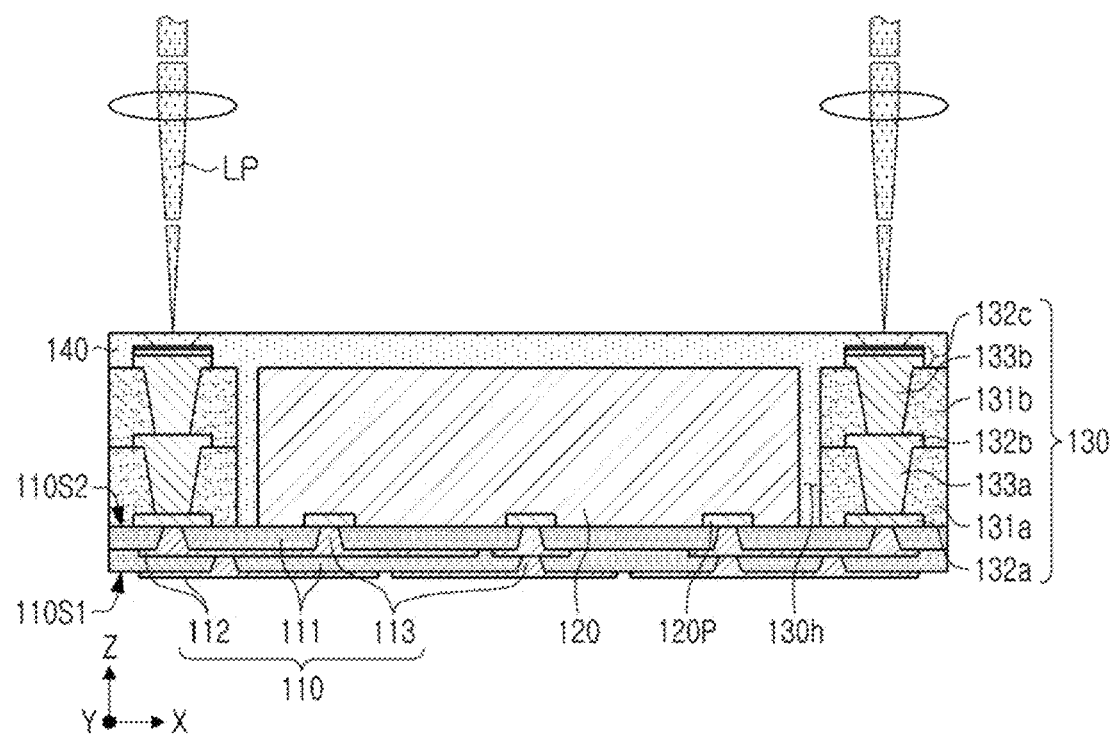

FIGS. 9A to 9C are views illustrating a process sequence to illustrate a method of manufacturing a semiconductor package according to example embodiments.

Referring to FIGS. 8 and 9A, a pad pattern 132c including a metal film ML3 may be formed on a semiconductor chip 120 (S10). An encapsulant 140, an insulating layer, covering the pad pattern 132c may be formed (S20).

In detail, first, a vertical connection structure 130 including the pad pattern 132c may be formed on a first carrier 50, and the semiconductor chip 120 may be accommodated in a through-hole 130h of the vertical connection structure 130. The vertical connection structure 130 may include a wiring structure together with first and second insulating layers 131a and 131b, and the wiring structure may include wiring layers 132a, 132b, and 132c and wiring via layers 113a and 113b connecting the wiring layers. The pad pattern, the wiring layer 132c on the uppermost level, may include a first metal layer ML1, a second metal layer ML2, and a third metal layer ML3, the metal film. The third metal layer ML3 may be roughened. The semiconductor chip 120 may be disposed in the through-hole 130h such that a connection pad 120P faces the first carrier 50. Therefore, the pad pattern 132c may be formed on, e.g., on a layer on, the semiconductor chip 120.

In an example embodiment, the formation of the vertical connection structure 130 may be omitted. In this case, a redistribution substrate 110 may be formed by stacking redistribution layers 112 on the semiconductor chip 120, or a redistribution substrate 110 may first be formed on the first carrier 50, and then the semiconductor chip 120 may be mounted on an upper surface 110S2 of the redistribution substrate 110 by a flip-chip method or by a wire bonding method.

The encapsulant 140 may be formed to extend to an upper surface of the vertical connection structure 130 to cover the pad pattern 132c. The encapsulant 140 may fill a space between an inner wall of the through-hole 130h and a side surface of the semiconductor chip 120. The encapsulant 140 may be formed by applying and curing a molding material, and grinding a non-active surface side of the semiconductor chip 120.

Referring to FIG. 9B, a redistribution substrate 110 may be formed.

After the first carrier 50 is removed, the package under manufacture of FIG. 9A may be turned upside down, may be attached to the second carrier 60, and a process of forming a redistribution substrate 110 may be then performed.

The redistribution substrate 110 may be prepared by forming an insulating layer 111 using a lamination or coating method, forming a via hole in the insulating layer 111, and forming the redistribution layer 112 as a first redistribution layer and the redistribution via 113 as a first redistribution via, e.g., using electrolytic plating or electroless plating. A PID may be used an insulating layer, and the via holes may be formed with a fine pitch by using a photolithography method.

After the second carrier 60 is removed, the package under manufacture of FIG. 9B may be turned upside down.

Referring to FIGS. 8 and 9C, a laser beam LP may be irradiated to the encapsulant 140 (which is an insulating layer) to form an opening 140h that exposes at least a portion of a surface of the metal film ML3 of the pad pattern 132c (S30).

In detail, laser processing of irradiating a laser beam LP having a specific condition to the encapsulant 140 may be performed. By the laser processing, a portion of the encapsulant 140 on the pad pattern 132c may be removed.

The laser beam LP may be a pulse laser having a wavelength having a high absorption for a metal material such as the pad pattern 132c (e.g., using a light source having a wavelength of about 343 nm to about 355 nm), a peak power of 0.13 kW to about 0.43 kW, and a pulse width equal to or less than nanoseconds. The pulse width of the laser beam LP may be, e.g., about 20 ns to about 100 ns. Energy concentration of the laser beam LP may be about 0.8 mJ/cm$^2$ or less.

The laser beam LP may remove the encapsulant 140 on the pad pattern 132c, and the laser processing may result in polycrystalline plastic deformation and smoothing of the irradiated surface of the pad pattern 132c such that smearing does not remain on the pad pattern 132c.

Figure 10A:
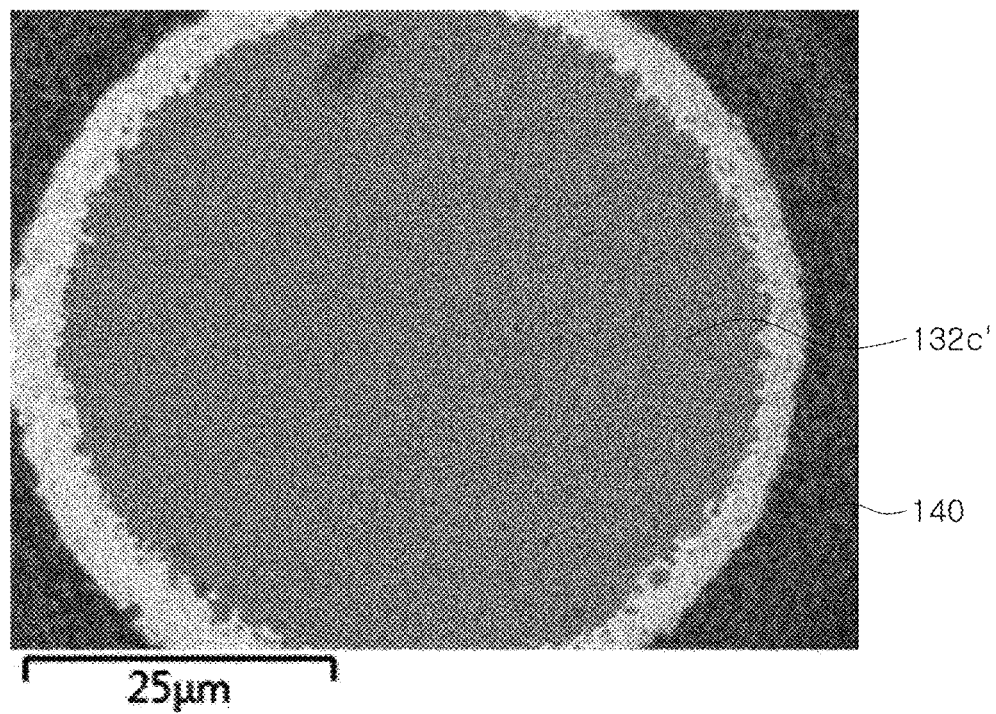
FIGS. 10A and 10B are scanning electron microscope (SEM) images illustrating a pad pattern of a semiconductor package according to a comparative example.
Figure 10B:
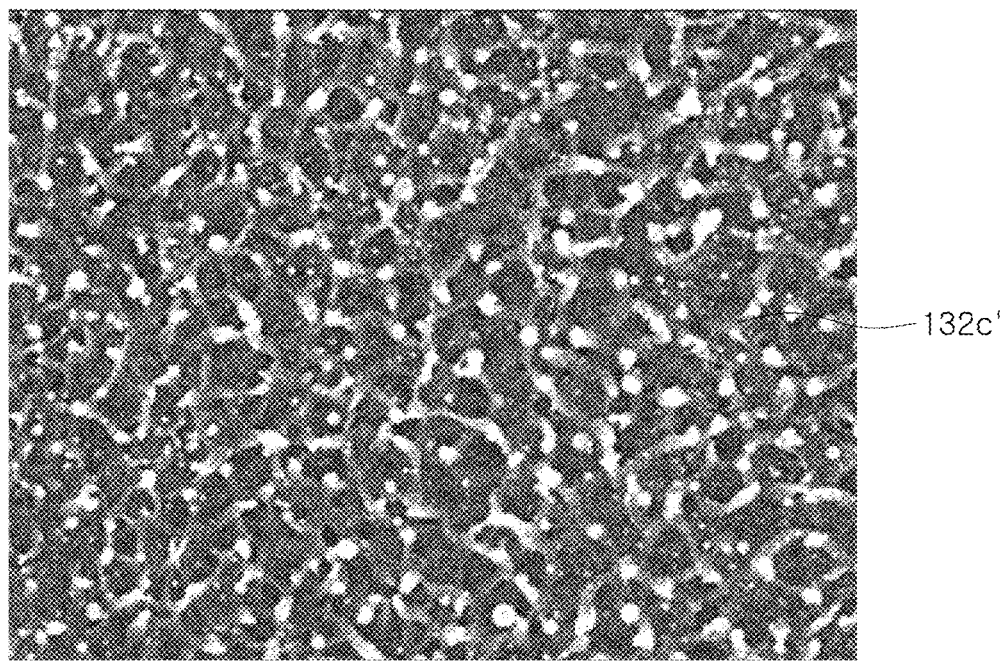
Figure 10C:
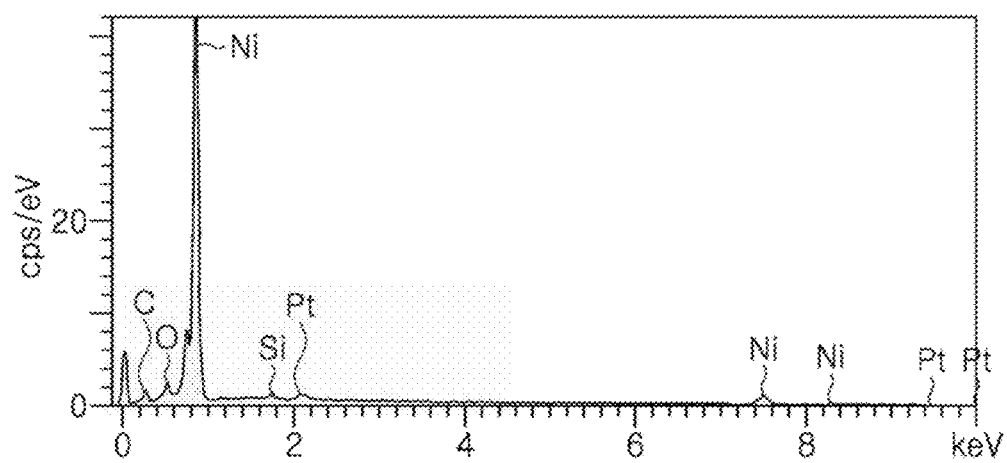
FIG. 10C is a graph illustrating a result of elemental element analysis of a surface of a pad pattern of a semiconductor package according to a comparative example.

FIGS. 10A and 10B are scanning electron microscope (SEM) images illustrating a pad pattern of a semiconductor package according to a comparative example. FIG. 10C is a graph illustrating a result of elemental element analysis of a surface of a pad pattern of a semiconductor package according to a comparative example.

An example embodiment may perform the laser processing using the laser beam LP to remove smearing at the same time as forming the opening exposing the pad pattern 132c, without a chemical desmearing process and thus simplifying a manufacturing process and secure reliability of the pad pattern 132c.

For example, as discussed above in connection with FIGS. 3A to 3D, an amount of residues from resin and filler remaining on the pad pattern 132c was significantly reduced, as compared to the comparative example in which laser processing using a $CO_2$ laser was performed on the encapsulant 140_C as shown in FIGS. 3A to 3D.

When a pulse laser having less than picoseconds was used as the laser beam LP, the same results, as in FIGS. 10A to 10C, were confirmed. When laser processing was performed using a laser having a pulse width of picoseconds, a metal film including gold (Au) was damaged and removed by the laser processing. As shown in FIG. 10C, considering that gold (Au) was hardly present on a surface of a pad pattern 132c', and a nickel (Ni) element constituting a second metal layer ML2 was detected, it can be confirmed that a third metal layer ML3 was damaged and removed by the laser processing. The laser beam LP may thus use a nanosecond pulse laser, to prevent damage to the third metal layer ML3 and remove smearing on a surface of the third metal layer ML3 without using a chemical desmearing process.

After forming the opening exposing the pad pattern 132c or 132c', the protective layer 114 may be formed, an opening may be formed in the protective layer 114, and an under-bump metal layer 150 and a connection bump 160 may be formed to manufacture the semiconductor package 100A of FIGS. 1 and 2.

By way of summation and review, in order to improve reliability of the semiconductor package, a process of removing smearing between the connection bump and the redistribution layer (or pad) is desired.

Embodiments may provide a method whereby a pad pattern may be formed to be exposed through an opening of an insulating layer, to provide a semiconductor package having excellent reliability, and a method of manufacturing the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a semiconductor package, the method comprising:
   forming a pad pattern including a metal film on a semiconductor chip;
   forming an insulating layer covering the pad pattern and including an organic insulating material; and
   forming an opening exposing a surface of the metal film of the pad pattern by performing a laser processing on the insulating layer,
   wherein, in forming the opening, a region of the metal film is plastically deformed by the laser processing.

2. The method as claimed in claim 1, wherein the metal film is changed from an isotropic single crystal structure to an anisotropic polycrystalline structure by the laser processing.

3. The method as claimed in claim 1, wherein the insulating layer includes an epoxy resin and an inorganic filler.

4. The method as claimed in claim 1, wherein the exposed surface of the metal film has a smear-less structure in which a residue formed while a portion of the insulating layer is removed by the laser processing does not remain on the exposed surface of the metal film.

5. The method as claimed in claim 1, wherein a thickness of the metal film is 200 nm to 500 nm.

6. The method as claimed in claim 5, wherein the pad pattern further includes a first metal layer, and a second metal layer between the first metal layer and the metal film.

7. The method as claimed in claim 6, wherein:
   a thickness of the first metal layer is about 2 μm to 10 μm, and
   a thickness of the second metal layer is 2 μm to 5 μm.

8. The method as claimed in claim 6, wherein:
   the first metal layer includes copper (Cu),
   the second metal layer includes nickel (Ni), and
   the metal film includes gold (Au).

9. The method as claimed in claim 1, wherein a light source of a laser beam used in the laser processing has a wavelength of 343 nm to 355 nm.

10. The method as claimed in claim 1, wherein a pulse width of a laser beam used for the laser processing is 20 nanosecond (ns) to 100 ns.

11. The method as claimed in claim 1, wherein a peak power of a laser beam used in the laser processing is 0.13 kW to 0.43 kW.

12. A method for manufacturing a semiconductor package, the method comprising:
  forming a vertical connection structure including an insulating layer and a pad pattern on the insulating layer, the vertical connection structure having a through-hole;
  mounting a semiconductor chip in the through-hole of the vertical connection structure;
  forming an encapsulant encapsulating the semiconductor chip and covering the pad pattern; and
  forming an opening in the encapsulant to expose a surface of the pad pattern by performing a laser processing on the encapsulant on the pad pattern,
  wherein the pad pattern includes a metal layer and a metal film disposed on the metal layer, the metal film having a thickness that is smaller than a thickness of the metal layer, and
  wherein the metal film includes a first region exposed through the opening and crystallized by the laser processing, and a second region surrounding the first region.

13. The method as claimed in claim 12, wherein the metal film includes copper (Cu) or gold (Au), and is formed to have a thickness of 200 nm to 500 nm.

14. The method as claimed in claim 12, wherein a laser beam used in the laser processing has a wavelength of 343 nm to 355 nm, and a pulse width of 20 nanosecond (ns) to 100 ns.

15. The method as claimed in claim 12, wherein:
  the encapsulant includes an epoxy resin and an inorganic filler, and
  a residue of the encapsulant does not remain on a surface of the metal film exposed through the opening in forming of the opening.

16. The method as claimed in claim 12, wherein a dislocation density of the first region is greater than a dislocation density of the second region.

17. The method as claimed in claim 12, wherein:
  the first region is changed from an isotropic single crystal structure to an anisotropic polycrystalline structure by the laser processing, and
  the second region has the isotropic single crystal structure.

18. A method for manufacturing a semiconductor package, the method comprising:
  forming a pad pattern including a first metal layer, a second metal layer, and a third metal layer on a semiconductor chip;
  forming an insulating layer covering the pad pattern and including an organic insulating material; and
  forming an opening exposing at least a portion of a surface of the third metal layer by irradiating a laser beam to the insulating layer,
  wherein the laser beam has a wavelength of 343 nm to 355 nm, and a pulse width of 20 nanosecond (ns) to 100 ns, and
  wherein in forming the opening, a region of the third metal layer is plastically deformed.

19. The method as claimed in claim 18, wherein:
  the third metal layer includes copper (Cu) or gold (Au), and is formed to have a thickness of 200 nm to 500 nm,
  a thickness of the first metal layer is 2 μm to 10 μm, and
  a thickness of the second metal layer is 2 μm to 5 μm.

20. The method as claimed in claim 18, wherein:
  the third metal layer includes a first region that is the region that is plastically deformed, and a second region surrounding the first region, and
  the first region is changed from an isotropic single crystal structure to an anisotropic polycrystalline structure by partially absorbing the laser beam.

* * * * *